United States Patent [19]

Ackerman et al.

[11] Patent Number: 5,503,874
[45] Date of Patent: Apr. 2, 1996

[54] METHOD FOR LOW TEMPERATURE CHEMICAL VAPOR DEPOSITION OF ALUMINIDES CONTAINING EASILY OXIDIZED METALS

[75] Inventors: John F. Ackerman, Cheyenne, Wyo.; William R. Stowell, Rising Sun, Ind.; John H. Wood, St. Johnsville; Adrian M. Beltran, Ballston Spa, both of N.Y.

[73] Assignee: General Electric Company, Schenectady, N.Y.

[21] Appl. No.: 315,805

[22] Filed: Sep. 30, 1994

[51] Int. Cl.$^6$ ............................ B05D 7/22; C23C 16/00
[52] U.S. Cl. ................. 427/237; 427/238; 427/239; 427/250; 427/253; 427/255.1; 427/255.2; 427/255.7; 427/124; 427/126.3; 427/383.7
[58] Field of Search ........................ 427/250, 253, 427/255.1, 255.2, 252, 255.7, 237, 238, 239, 124, 126.3, 383.7; 428/908.8

[56] References Cited

U.S. PATENT DOCUMENTS

| | | | |
|---|---|---|---|
| Re. 33,876 | 4/1992 | Goward et al. | 428/633 |
| 5,292,594 | 3/1994 | Liburdi et al. | 428/650 |
| 5,314,866 | 5/1994 | Berry et al. | 505/447 |
| 5,384,200 | 1/1995 | Giles et al. | 428/552 |
| 5,407,705 | 4/1995 | Vakil | 427/255 |

OTHER PUBLICATIONS

Sasaoka et al, Appl. Phys. lett. vol. 55, No. 8, 21 Aug. 1989, pp. 741–743.

"Thin Film Processes", edited by J. L. Vossen and W. Kern, Academic Press (1978) pp. 257–331.

*Primary Examiner*—Roy V. King
*Attorney, Agent, or Firm*—Noreen C. Johnson; James Magee, Jr.

[57] ABSTRACT

A method is disclosed to deposit aluminum and a metal oxide on substrates for improved corrosion, oxidation, and erosion protection. Low temperature chemical vapor deposition is used. A homogeneous biphase coating may be deposited, as well as layers of aluminum and metal oxides.

12 Claims, No Drawings

METHOD FOR LOW TEMPERATURE CHEMICAL VAPOR DEPOSITION OF ALUMINIDES CONTAINING EASILY OXIDIZED METALS

CROSS-REFERENCE TO RELATED APPLICATION

This application is related to the following copending application which is commonly assigned and is incorporated herein by reference: J. F. Ackermann et al., "Low Temperature Chemical Vapor Deposition Method for Cleaning Substrate and Depositing Protective Coating," U.S. application Ser. No. 08/315,807, filed concurrently herewith.

1. Field of the Invention

The present invention relates to a method for protecting substrate surfaces from corrosion, oxidation, and erosion by depositing an aluminium and easily oxidized metal specie by low temperature chemical vapor deposition.

2. Background of the Invention

Coatings from chemical vapor deposition, herein sometimes referred to as CVD, are used extensively in applications requiring resistance to wear, erosion, and corrosion, very often over a wide range of temperatures.

More often than not, the purpose of the coating is multifunctional. An example is the coating for a turbine parts, such as blades and vanes, to provide protection against wear and erosion of a corrosive environment at high temperature as well as protection against erosion by sand and other foreign particles. Various types of turbine hardware need to be protected from corrosion due to high temperature oxidation of the constituent alloy substrate, often nickel or cobalt based alloys. Aluminum is often the coating material chosen to protect turbine hardware involving the formation of aluminum oxide ($Al_2O_3$) and metal-aluminum oxide layers.

To date, several methods to coat the external surface of turbine blades have been developed. One method is pack cementation, which consists of packing a powder mixture around the part to be coated and then heating the part and mixture to coat the external surface with aluminum. This method, however, does not uniformly and reproductively coat internal air cooling passages which are used in most turbine blade designs. When the blade design permits packing the internal air passages with the powder mixture, problems arise because the pack cementation materials are often difficult to remove, and the operation is labor intensive.

Copending and commonly assigned U.S. application, "Low Temperature Chemical Vapor Deposition Method for Cleaning Substrate and Depositing Protective Coating," Ser. No. 08/315,807 teaches a method to deposit aluminum coatings on turbine blades. Being a vapor deposition process, the internal blade passages are coated uniformly. However, to incorporate additional metals in the aluminum coating to improve corrosion, oxidation, and erosion protection, pack cementation method is still being utilized.

In the pack cementation process, metal powders, such as hafnium, are packed around the part and heated to high temperatures around 1050° C. to diffuse the hafnium and aluminum to form a metal aluminide. As a result of the high temperatures, grain growth, creep, and other thermo-mechanical failure mechanisms can happen which decrease the strength and life of the part. Also, as mentioned above, packing the internal air passages of turbine parts with the powder mixture leads to problems because the pack cementation materials are often difficult to remove, and the operation is labor intensive.

Thus, there is a need for a process that uniformly coats the internal and external parts of turbine hardware by low temperature chemical vapor deposition of aluminum with metal oxides to further improve corrosion, oxidation, and erosion protection of the substrate material.

SUMMARY OF THE INVENTION

The present invention fulfills this need by providing a method to deposit homogeneous biphase mixtures of aluminum and an easily oxidized metal specie on a substrate by low temperature chemical vapor deposition, thereby eliminating the tedious step of pack cementation and further providing uniform coverage of substrates with internal and external surface areas.

The method of the present invention is directed to coating internal and external surfaces of a substrate with a homogeneous biphase protective coating, said method comprising: depositing simultaneously on the surfaces of the substrate by low temperature chemical vapor deposition at a temperature up to about 600° C., a homogeneous biphase mixture comprising aluminum and a metal oxide, where said aluminum is deposited in a stoichiometric amount greater than or equal to a ten fold excess of the metal oxide from an aluminum alkyl halide precursor, and where said metal oxide is deposited from a metal Beta-diketonate precursor.

The terms "homogeneous biphase coating" or "homogeneous biphase mixture", as used herein, mean the aluminum and metal oxide are codeposited on a substrate surface in an amount specified by the desired application of the coating, where the aluminum in the coating or mixture is at least ten times the amount of the metal oxide present in the coating or mixture.

Additionally, the present invention is directed towards a method to protect internal and external surfaces of a substrate with alternating layers of aluminum and a metal oxide, said method comprising: (a) depositing on the surfaces of said substrate a layer of aluminum by low temperature chemical vapor deposition at a temperature up to about 500° C., where said aluminum layer is about 0.5–2.0 microns thick, from an aluminum alkyl halide precursor, and deposited in a stoichiometric amount greater than or equal to a ten fold excess of a metal oxide; (b) depositing on said aluminum layer, a metal oxide layer by low temperature chemical vapor deposition at a temperature up to about 600° C., where said metal oxide layer is about 0.005–0.020 microns thick and is deposited from a metal Beta-diketonate precursor; and (c) repeating steps (a) and (b) until a total thickness of about 25–125 microns is deposited.

In the above methods of the present invention, the aluminum and metal oxide are deposited by low temperature chemical vapor deposition. Such low temperature chemical vapor deposition is conducted in accordance with methods known to those skilled in the art. The term "low temperature" chemical vapor deposition, as used herein, means that the temperature of the chemical vapor deposition is about 600° C. or lower, depending on the precursors chosen. In the practice of this invention, the use of low temperature chemical vapor deposition permits the use of a broader spectrum of substrates.

The time to deposit the aluminum and metal oxide is dependent on the desired thickness of the homogeneous biphase coating and the operational parameters chosen to run the low temperature chemical vapor deposition process. Generally, a thickness for the coating is specified per part or application and one skilled in the art is then able to ascertain the deposition parameters. As an example, for protective coatings on turbine parts exposed to in-service temperatures around 1100° C., a suitable thickness for the biphase homogeneous mixture of aluminum and metal oxide may be about 25–125 microns. Likewise, when practicing this invention by alternating layers of aluminum and metal oxide, a total thickness of the combined layers is about 25–125 microns.

An important aspect of the present invention is the broad spectrum of substrate materials that can be utilized due to the low deposition temperature. Another important advantage of the invention is the improved corrosion resistance of the substrate by the aluminum and metal oxide coating.

Additional advantages of the present invention include the high throwing power of the CVD process, the uniform coverage of hard to reach internal passages of turbine parts due to the utilization of a flowing process, and the elimination of a heat treating step to regenerate the original substrate microstructure when high temperature CVD (about 1100° C.) is used.

DETAILED DESCRIPTION OF THE INVENTION

The method of the present invention provides a means of providing corrosion resistant aluminides. The method entails low temperature chemical vapor deposition of aluminum and a metal oxide, such as yttrium oxide, onto high temperature turbine alloys. After the co-deposition of the aluminum and metal oxide onto a substrate, the coated substrate is heated to reduce the metal oxide with an excess of aluminum thereby forming an aluminide containing a small percentage of the metal.

Substrates include, but are not limited to, nickel based, cobalt based, and iron based alloys. The alloys may be cast or wrought superalloys. Examples of such substrates are GTD-111, GTD-222, Rene 80, Rene 41, Rene 125, Rene 77, Rene 95, Inconel 706, Inconel 718, Inconel 625, cobalt-based HS188, coobalt-based L-605, and stainless steels. The process is especially suited for coating parts and hardware used in turbines. An example of a turbine part would be a turbine blade or vane.

Additional substrate materials, that can accommodate an aluminum-metal oxide coating for applications other than turbine parts, may be used in this invention. For instance, it is also contemplated that this invention may be utilized for coatings in marine environments, electronic applications, and power generators, such as gas, steam, and nuclear, to mention a few.

The present invention is applicable to any known process for the low temperature chemical vapor deposition of a metal on a substrate. The following detailed description of the invention referring to one type of vapor deposition process is representative of the practice of the invention using other types of conventional low temperature CVD processes with aluminum alkyl halides and metal Beta-diketonates.

Aluminum is deposited from a precursor such as an aluminum alkyl halide. The aluminum alkyl halide can be a chloride, bromide or iodide compound so long as it is stable at about 25° C. In the chemical vapor deposition reactor, the aluminum precursor is stored in a effusion cell separate from the metal oxide precursor.

The metal oxide codeposited with the aluminum in the process may be selected from yttrium oxide ($Y_2O_3$), zirconium oxide ($ZrO_2$), chromium oxide ($Cr_2O_3$), hafnium oxide ($HfO_2$), and other metal oxides that are reduced by an excess of aluminum. Such metal oxides are deposited from precursors which are generally metal Beta-diketonates. For example, yttrium oxide is deposited from yttrium tris(acetylacetonate), zirconium oxide is deposited from zirconium tetrakis-(acetylacetonate), chromium oxide is deposited from chromium tris-(acetylacetonate), and hafnium oxide is deposited from hafnium tetrakis(acetylacetonate). In the CVD reaction chamber, the metal oxide precursor is stored in a separate effusion cell than the aluminum precursor effusion cell. This means that the CVD reactor has at least two effusion cells, one with an aluminum precursor and one with a metal oxide precursor.

During deposition of a homogeneous biphase mixture of aluminum and metal oxide, the aluminum is deposited in at least a ten fold stoichiometric excess of the metal oxide, and preferrably a 99 fold stoichiometric excess. For instance, the deposit would have 99 moles of aluminum to 1 mole of metal oxide. The parameters of the CVD reaction are run to control the amount of aluminum and metal oxide deposited, based on the desired excess of aluminum required by the application of the coating on the article. The total thickness of the codeposition of aluminum and metal oxide is generally between about 25–125 microns, but is not limited to only this thickness range.

When alternating layers of aluminum and metal oxide are deposited, each layer is controlled by its thickness. Aluminum is deposited from a separate effusion cell in the CVD reactor at a temperature up to about 500° C. until about 0.50–2.0 microns is deposited. The effusion cell with the aluminum precursor is then closed, and the effusion cell with the metal Beta-diketonate precursor is opened. At a temperature up to about 600° C., the metal oxide is deposited onto the aluminum layer in an amount much smaller than the aluminum, generally between about 0.005–0.020 microns. By closing the metal Beta-diketonate effusion cell and reopening the aluminum precursor cell, the process is repeated with alternating layers of aluminum and metal oxide until a total thickness is achieved. Such thickness is dictated by the application of the coating and its specified thickness.

The above thickness ranges for the homogeneous biphase deposition method and the alternating layer deposition method are given as examples for turbine parts. Other thickness ranges may be used depending on the application of the coating.

In the practice of the present invention, low temperature chemical vapor deposition is used with an aluminum alkyl halide as a precursor and a metal Beta-diketonate precursor to deposit aluminum and a metal oxide on a substrate, preferably a metal substrate that is a nickel or cobalt based alloy. The metal substrate must be thick enough to later form an aluminide layer on its surface. Depending on the metal substrate, the aluminide forms after the deposition of aluminum and the metal oxide by low temperature chemical vapor deposition and subsequent interdiffusion of the aluminum and the substrate base metal during heat treatment. During the heat treatment, the metal oxide is reduced by the aluminum so that the aluminide contains small amounts of the metal from the metal oxide.

The temperature employed during the chemical vapor deposition process is about 600° C. or less, with the preferred range between about 100°– 500° C., and the most preferred range between about 280°– 420° C. Some metal oxides, such as hafnium oxide, are deposited between about 550°–600° C.

An example of a CVD apparatus for the practice of this invention consists of effusion cells with plumbing fixtures capable of volatilizing and bringing to the substrate a sufficient quantity of the aluminum precursor and the metal oxide precursor to coat the substrate with aluminum and the metal oxide.

One or more substrates may be coated at the same time. The apparatus has an airtight reactor volume which contains the substrate and a heating means for the substrate. The heating means is chosen from conventional methods known to those skilled in the art, including, but not limited to, resistive heating, induction heating by radio frequency (RF), and fuel fired furnaces. Additionally, the CVD apparatus has a system of traps, condensers, and vacuum pumps capable of maintaining a vacuum in the reactor and effusion cell during the process. The substrate is fixed to the effusion cell outlet in a manner as to force a majority of the reagent through the internal passages of the substrate. Common engineering principles, known in the art, can be used for this purpose.

In a normal run of the CVD process, the substrate is placed in the reactor, the reactor evacuated to 10–15 millitorr (mtorr) pressure to remove oxygen, and then heated to the reaction temperature. After the reactor is evacuated, the process may be run at a pressure between about 10 millitorr to about 10 torr. A preferred range is between about 100–500 millitorr.

The reaction temperature is dependent on the precursor chosen and its volatilization temperature. Different organic halides vaporize at different temperatures. For instance, when diethyl aluminum chloride is the precursor, the chemical vapor deposition temperature is chosen between about 300°– 400° C. The vaporization temperatures of aluminum alkyl halides can be obtained from chemical handbooks displaying physical properties of chemical compounds.

When the reactor is at the selected reaction temperature, the effusion cells are opened simultaneously where the aluminum alkyl halide vapors and metal oxide precursor vapors pass through the plumbing into the heated zone. Upon passing into the heated zone, the vapors surround the external portions of the substrate and penetrate the internal substrate passages. An alternate method is depositing an aluminum layer and a metal oxide layer where then the effusion cells are opened sequentially. This means that when one cell is open the other cell is closed.

The following example further demonstrates the invention.

EXAMPLE 1

This is for the deposition of aluminum and yttrium by alternating the layers. During operation by low temperature chemical vapor deposition, the substrate to be coated is placed into a tube area where vapors react to deposit the aluminum and metal oxide on the substrate. The tube area is evacuated to remove oxygen to twenty millitorr and the furnace which surrounds the tube, is brought to about 440° C. The aluminum is deposited according to the above mentioned method. After the aluminum is deposited in an amount of about 1 micron thick, the aluminum effusion cell is closed. The furnace is brought to about 540° C. At this point, the yttrium tris-(acetylacetonate) in the effusion cell is heated to 150° C. When it reaches that temperature, the valve connecting it to the tube holding the substrates is opened and the vapors of the metal oxide reagent are allowed to pass into the tube and over the substrate. The total pressure in the tube is about 100 millitorr. The vapors decompose to form yttrium oxide on the aluminum layer. Some carbon may deposit as an impurity. The rate of deposition under these conditions is one Angstrom per second. About 100 Angstroms thick of yttrium oxide are deposited. When the desired thickness of yttrium oxide is deposited, the valve leading from the effusion cell is closed. The process is repeated to deposit the aluminum layer onto the yttrium oxide layer, and so on. After the final layer is deposited, the effusion cells are both closed and the pressure control valve is opened. The furnace power is disconnected. After several hours, the apparatus will cool to ambient temperatures. Then, the vacuum pump is turned off and the system is pressurized to atmospheric pressure. The tube is then opened and the coated substrates extracted.

What is claimed is:

1. A method to form an aluminide layer on internal and external surfaces of a metal substrate with a homogeneous biphase protective coating, said method comprising: depositing simultaneously, aluminum and a metal oxide capable of being reduced by aluminum, on the surfaces of the metal substrate by low temperature chemical vapor deposition at a temperature up to about 600° C., to form a homogeneous biphase mixture, of about 25–125 microns thick, where said aluminum is deposited in a stoichiometric amount greater than or equal to a ten fold excess of the metal oxide from an aluminum alkyl halide precursor, and where said metal oxide is deposited from a metal beta-diketonate precursor; and then heating the coated metal substrate to reduce the metal oxide to a metal by the aluminum while interdiffusing the aluminum and the reduced metal with the metal substrate to form the aluminide layer.

2. A method according to claim 1 where said metal substrate is selected from the group consisting of a nickel based alloy, a cobalt based alloy, and a iron based alloy.

3. A method according to claim 1 where said aluminum alkyl halide precursor is selected from the group consisting of aluminum alkyl chloride, aluminum alkyl bromide, and aluminum alkyl iodide.

4. A method according to claim 3 where said aluminum alkyl chloride is diethyl aluminum chloride.

5. A method according to claim 1 where said metal beta-diketonate precursor is selected from the group consisting of yttrium tris-(acetylacetonate), zirconium tetrakis-(acetylacetonate), chromium tris-(acetylacetonate), and hafnium tetrakis-(acetylacetonate).

6. A method to form an aluminide layer to protect internal and external surfaces of a metal substrate with alternating layers of aluminum and a metal oxide, said method comprising:

(a) depositing on the surfaces of said metal substrate a layer of aluminum by low temperature chemical vapor deposition at a temperature up to about 500° C., where said aluminum layer is about 0.5–2.0 microns thick, from an aluminum alkyl halide precursor, and deposited in a stoichiometric amount greater than or equal to a ten fold excess of the metal oxide;

(b) depositing on said aluminum layer, the metal oxide layer by low temperature chemical vapor deposition at a temperature up to about 600° C., where said metal oxide layer is about 0.005–0.020 microns thick and is deposited from a metal beta-diketonate precursor;

(c) repeating steps (a) and (b) until a total thickness of about 25–125 microns is deposited; and then (d) heating the coated metal substrate to reduce the metal oxide to a metal by the aluminum while interdiffusing the aluminum and the reduced metal with the metal substrate to form the aluminide layer.

7. A method according to claim 6 where said metal substrate is selected from the group consisting of a nickel based alloy, a cobalt based alloy, and a iron based alloy.

8. A method according to claim 6 where said aluminum alkyl halide precursor is selected from the group consisting of aluminum alkyl chloride, aluminum alkyl bromide, and aluminum alkyl iodide.

9. A method according to claim 8 where said aluminum alkyl chloride is diethyl aluminum chloride.

10. A method according to claim 6 where said metal beta-diketonate precursor is selected from the group consisting of yttrium tris-(acetylacetonate), zirconium tetrakis-(acetylacetonate), chromium tris-(acetylacetonate), and hafnium tetrakis-(acetylacetonate).

11. A method according to claim 2 where said metal substrate is a turbine part or a part for a gas, steam, or nuclear power generator.

12. A method according to claim 7 where said metal substrate is a turbine part or a part for a gas, steam, or nuclear power generator.

* * * * *